(12) United States Patent
Jain

(10) Patent No.: US 8,859,412 B2
(45) Date of Patent: Oct. 14, 2014

(54) OPTOELECTRONIC DEVICE CONTAINING AT LEAST ONE ACTIVE DEVICE LAYER HAVING A WURTZITE CRYSTAL STRUCTURE, AND METHODS OF MAKING SAME

(75) Inventor: Ajaykumar R. Jain, San Carlos, CA (US)

(73) Assignee: VerLASE Technologies LLC, Winooski, VT (US)

( * ) Notice: Subject to any disclaimer, the term of this patent is extended or adjusted under 35 U.S.C. 154(b) by 0 days.

(21) Appl. No.: 14/007,168

(22) PCT Filed: Feb. 9, 2012

(86) PCT No.: PCT/US2012/024399
§ 371 (c)(1),
(2), (4) Date: Sep. 24, 2013

(87) PCT Pub. No.: WO2012/138414
PCT Pub. Date: Oct. 11, 2012

(65) Prior Publication Data
US 2014/0024159 A1 Jan. 23, 2014

Related U.S. Application Data

(60) Provisional application No. 61/516,602, filed on Apr. 6, 2011, provisional application No. 61/573,709, filed on Sep. 12, 2011.

(51) Int. Cl.
*H01L 21/28* (2006.01)
*H01L 33/00* (2010.01)
(Continued)

(52) U.S. Cl.
CPC ........... *H01L 33/0083* (2013.01); *H01S 5/0206* (2013.01); *H01S 5/347* (2013.01); *H01L 21/02568* (2013.01); *H01L 33/26* (2013.01); *H01S 5/0217* (2013.01); *H01S 5/183* (2013.01); *H01S 5/327* (2013.01); *H01L 21/02551* (2013.01); *H01L 21/02521* (2013.01); *H01L 21/02557* (2013.01); *H01S 5/0425* (2013.01); *H01L 21/0237* (2013.01); *H01L 21/024* (2013.01); *H01L 21/02417* (2013.01); *H01L 33/0079* (2013.01); *H01L 33/0087* (2013.01); *H01L 33/005* (2013.01)

USPC .............. 438/603; 438/46; 257/E21.606

(58) Field of Classification Search
USPC ............... 438/77, 603, 607; 257/E21.543, 257/E21.603, E21.606, E21.607
See application file for complete search history.

(56) References Cited

U.S. PATENT DOCUMENTS 6,323,053 B1   11/2001  Nishikawa et al.
2010/0133529 A1  6/2010  Taraschi et al.

OTHER PUBLICATIONS

E. Wisotzki et al., "Quasi van der Waals epitaxy of ZnSe on the layered chalcogenides InSe and GaSe", Thin Solid Films 380 (2000), Elsevier Science B.V., pp. 263-265.

(Continued)

*Primary Examiner* — Cheung Lee
(74) *Attorney, Agent, or Firm* — Downs Rachlin Martin PLLC

(57) ABSTRACT

Optoelectronic devices, such as light-emitting diodes, laser diodes, image sensors, optical detectors, etc., made by depositing (growing) one or more epitaxial semiconductor layers on a monocrystalline lamellar/layered substrate so that each layer has a wurtzite crystal structure. In some embodiments, the layers are deposited and then one or more lamellas of the starting substrate are removed from the rest of the substrate. In one subset of such embodiments, the removed lamella(s) is/are partially or entirely removed. In other embodiments, one or more lamellas of the starting substrate are removed prior to depositing the one or more wurtzite-crystal-structure-containing layer(s).

22 Claims, 11 Drawing Sheets

(51) Int. Cl.
*H01S 5/02* (2006.01)
*H01S 5/347* (2006.01)
*H01L 21/02* (2006.01)
*H01L 33/26* (2010.01)
*H01S 5/183* (2006.01)
*H01S 5/327* (2006.01)
*H01S 5/042* (2006.01)

(56) References Cited

OTHER PUBLICATIONS

International Search Report and Written Opinion issued on Sep. 21, 2012, in connection with related PCT/US2012/024399, filed Feb. 9, 2012.

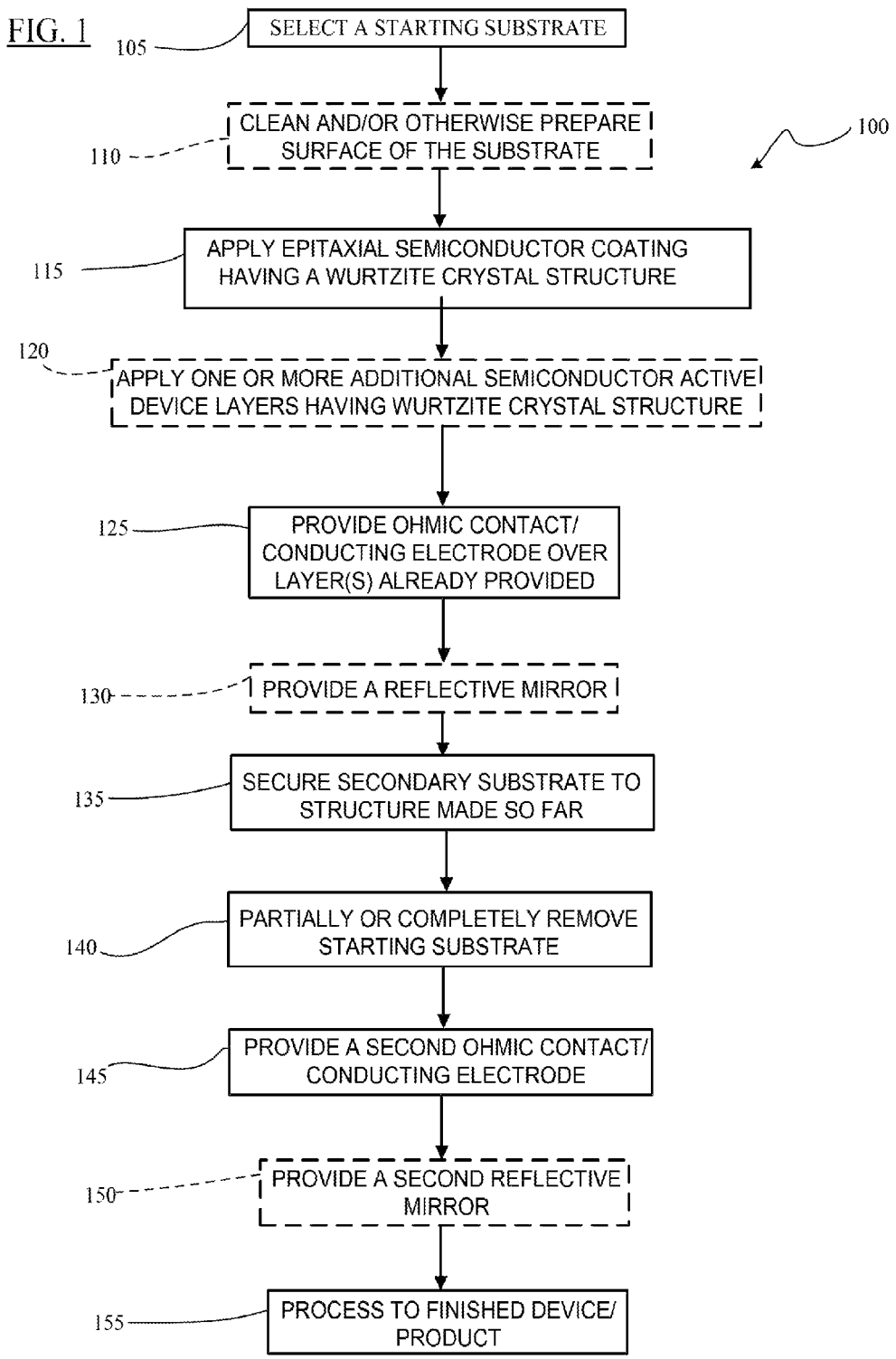

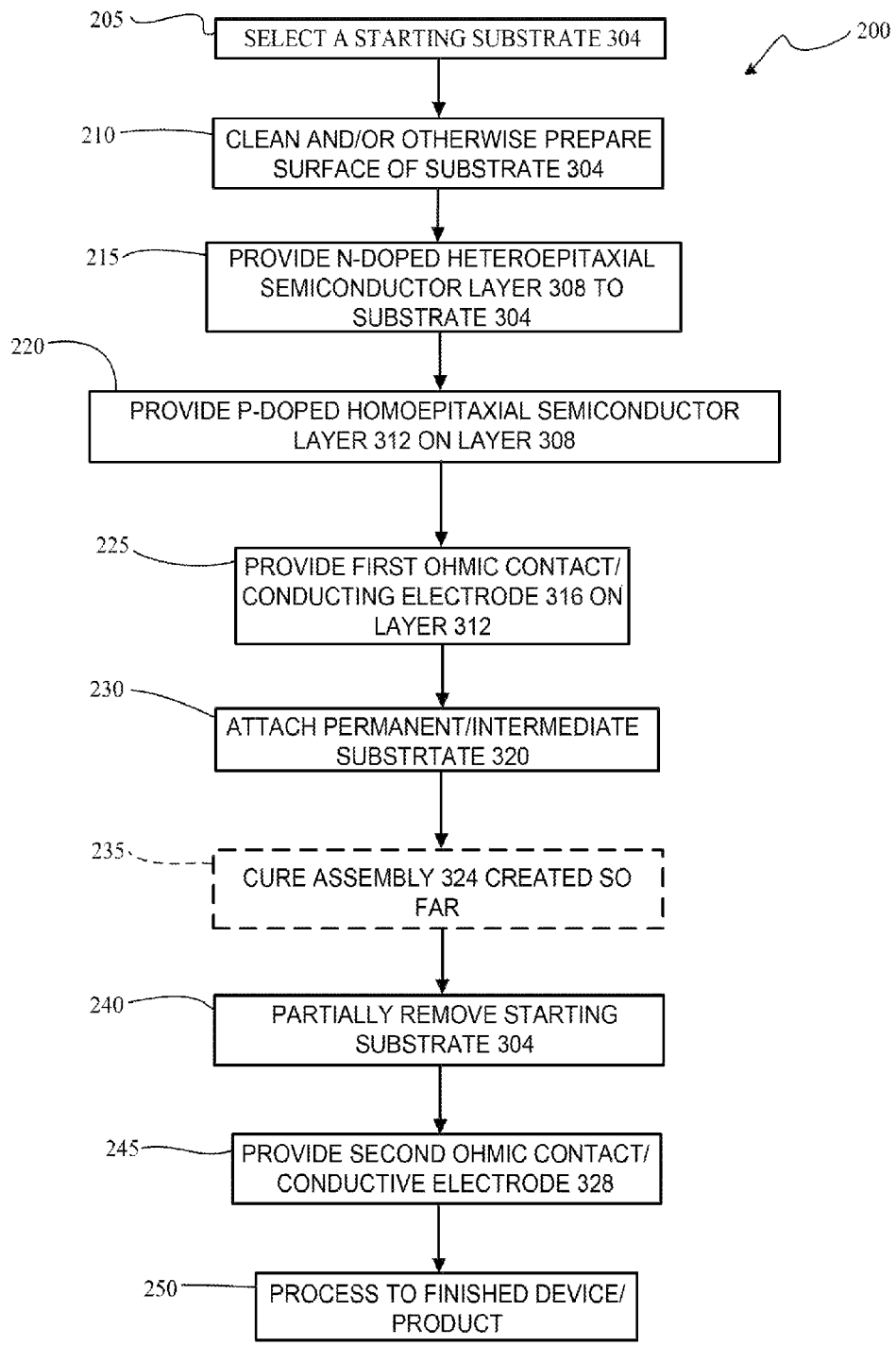

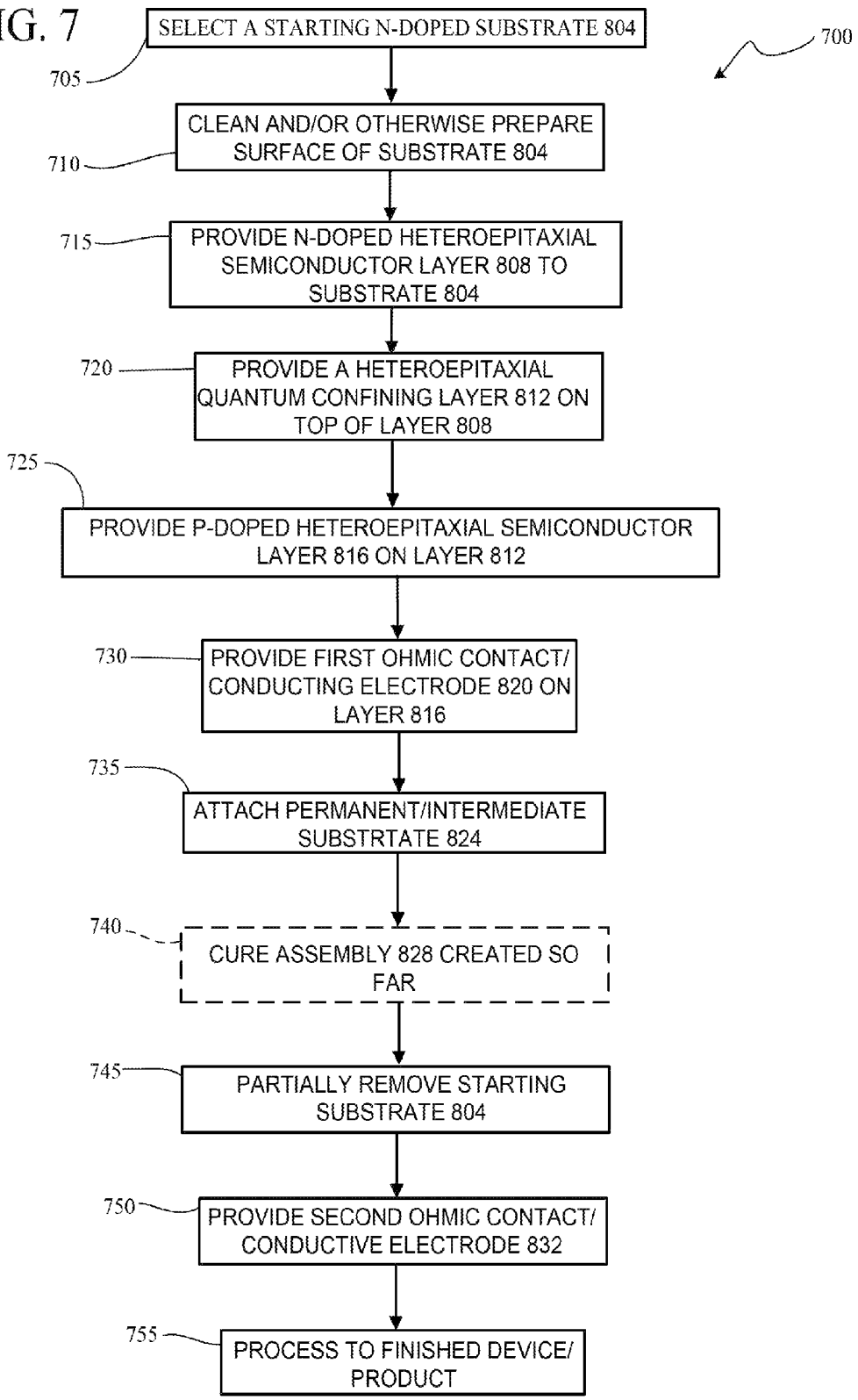

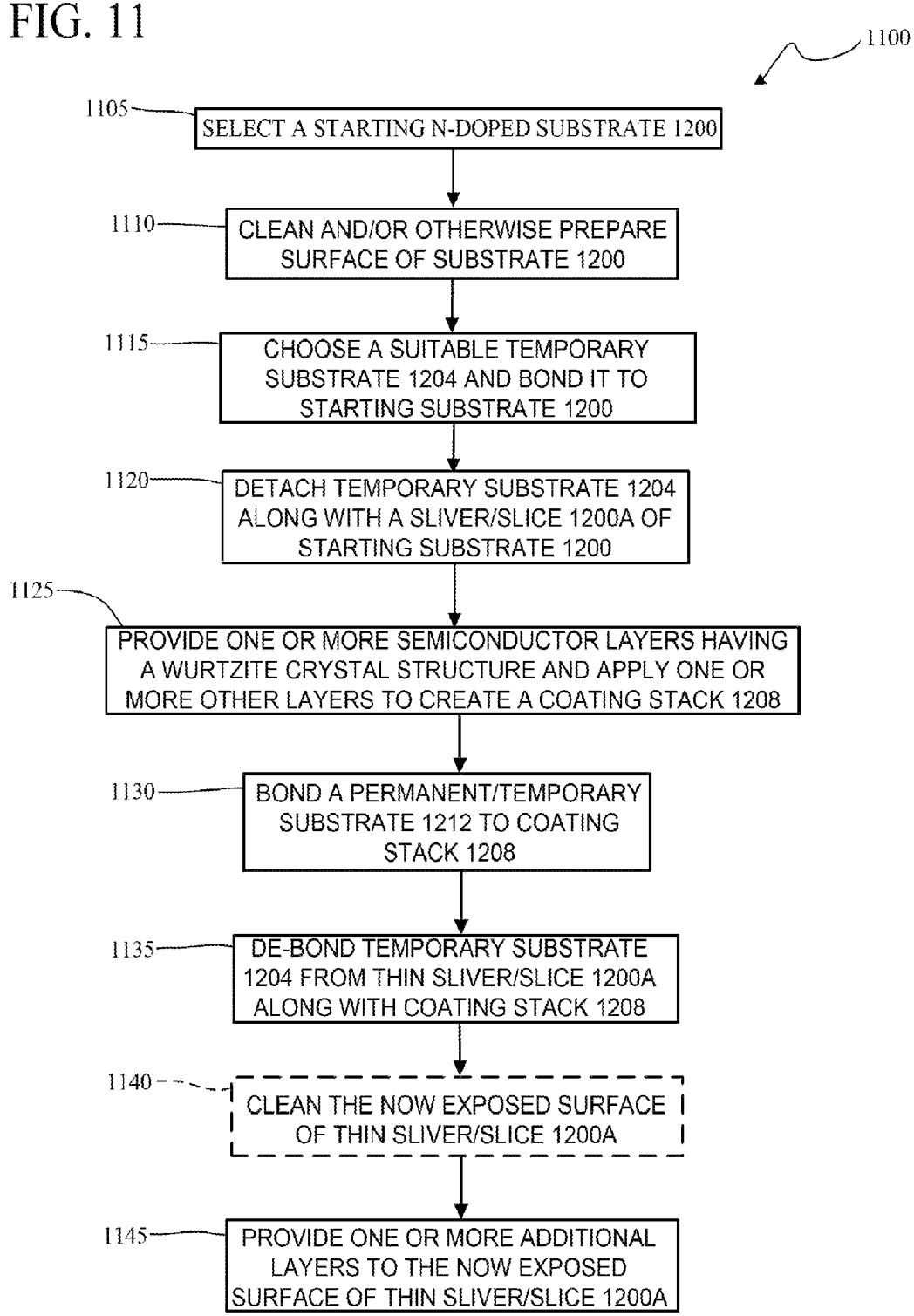

OPTOELECTRONIC DEVICE CONTAINING AT LEAST ONE ACTIVE DEVICE LAYER HAVING A WURTZITE CRYSTAL STRUCTURE, AND METHODS OF MAKING SAME

RELATED APPLICATION DATA

This application claims the benefit of priority of U.S. Provisional Patent Application Ser. No. 61/516,602, filed on Apr. 6, 2011, and titled "Novel Method of Making a Laser Diode," and U.S. Provisional Patent Application Ser. No. 61/573,709, filed on Sep. 12, 2011, and titled "Novel Method of Making a Laser Diode," each of which is incorporated by reference herein in its entirety.

FIELD OF THE INVENTION

The present invention generally relates to the field of semiconductor-based optoelectronic devices. In particular, the present invention is directed to an optoelectronic device containing at least one active device layer having a wurtzite crystal structure, and methods of making same.

BACKGROUND

As is well known, the human eye is sensitive to electromagnetic radiation having a wavelength in a range from about 400 nm to about 700 nm, i.e., in the visible spectrum. Of this range of sensitivity, the human eye is most sensitive to radiation at about 555 nm, which corresponds to the color green. This sensitivity has likely been fine tuned by nature/evolution to match the spectral peak of solar radiation falling on the Earth. Subtle variations in quality of green light strongly affects the quality of white light as perceived by humans.

High-performance blue light-emitting diodes/laser diodes (LEDs/LDs) based on indium-gallium-nitride (InGaN) and red LEDs based on aluminum gallium indium phosphorous (AlGaInP) systems have been available for some time. However, performance of electroluminescent green-light-emitting diodes has been sorely lagging, preventing the realization of white light by color mixing, such as by trichromatic LEDs. This is the so-called "Green Gap." Various techniques exist in production or are being pursued in research-and-development for realizing a high-performance green laser diode. Examples of such techniques and their drawbacks include: a) frequency doubling (low efficiency); b) using InGaN by modifying crystal orientation of a starting GaN substrate (temperature instability, limited solubility of indium in GaN, high-cost substrate platform, and increased dislocation densities with increased indium content); c) using II-VI wide-band-gap semiconductor materials (short continuous operation limits due to crystal defects); d) using GaInP alloy coatings on GaAs substrate (green LEDs only, no green LDs); e) using NZnO coatings on p-type GaN substrates (broadband green LEDs and no LDs); and f) using quantum dots in lieu of quantum wells (green LEDs only, no green LDs).

SUMMARY OF THE DISCLOSURE

In one implementation, the present disclosure is directed to a method of making an optoelectronic device. The method includes selecting a lamellar substrate such that the substrate has a crystal structure suitable for inducing a wurtzite crystal structure in at least one epitaxial semiconductor coating applied to the substrate; and forming the at least one epitaxial semiconductor coating on the lamellar substrate so that the at least one epitaxial semiconductor coating has the wurtzite crystal structure.

In another implementation, the present disclosure is directed to a semiconductor structure. The semiconductor structure includes an optoelectronic device that includes an active device region comprising a semiconductor coating having a wurtzite crystal structure, wherein the semiconductor coating is selected from a group consisting of a II-VI semiconductor material and a I-VI semiconductor material, the active device region having a first side and a second side opposite the first side; a first ohmic contact located on the first side of the active device region and in operative relation to the active device region; and a second ohmic contact located on the second side of the active device region and in operative relation to the active device region and the first ohmic contact.

In still another implementation, the present disclosure is directed to a structure. The structure includes a surface-emitting laser that includes a pair of spaced mirrors defining a resonator cavity; and a light-emitting structure located within the resonator cavity, the light-emitting structure comprising a plurality of differently doped semiconductor layers composed of at least one II-VI semiconductor material, each of the differently doped semiconductor layers having a wurtzite crystal structure; wherein the resonator cavity is configured, and the at least one II-VI semiconductor material is selected, so that the surface-emitting laser emits visible light.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 1 is a flow diagram of an exemplary generalized method of forming an optoelectronic device that includes an active device layer having a wurtzite crystal structure;

FIG. 2 is a flow diagram of a method of forming a light-emitting diode (LED) that includes a p-n junction formed by two heteroepitaxial layers having a wurtzite crystal structure;

FIG. 7 is a flow diagram of a method of forming an optoelectronic device having an architecture that allows band-gap engineering;

FIG. 11 is a flow diagram of another method of making an optoelectronic device by first cleaving an epitaxial growth platform from a starting substrate.

DETAILED DESCRIPTION

Figure 3A:
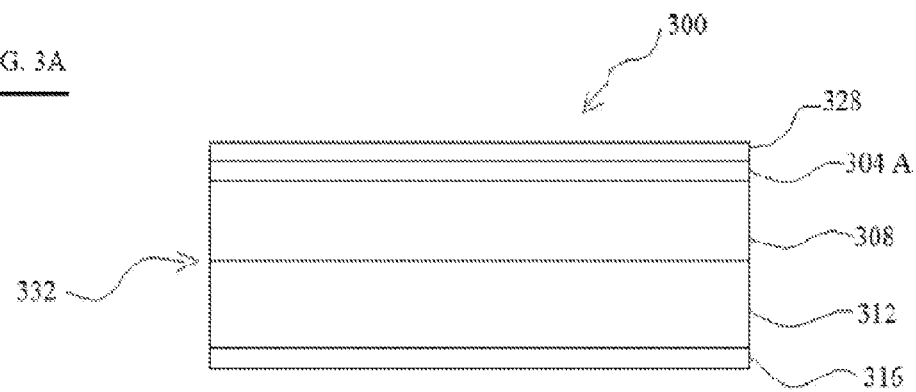
FIGS. 3A to 3H are schematic diagrams of the structures corresponding to various steps of the method of FIG. 2.
Figure 3B:
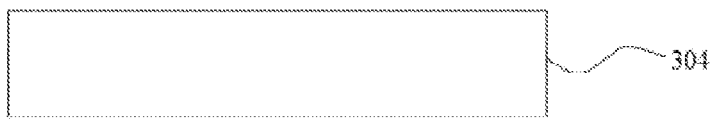
Figure 3C:
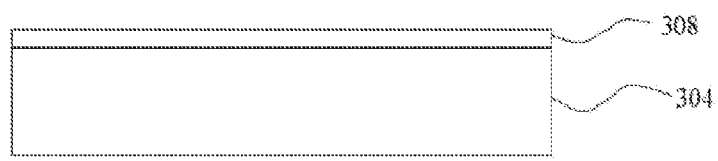
Figure 3D:
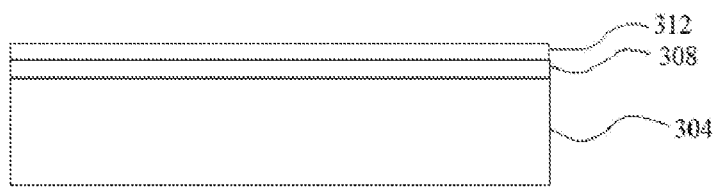
Figure 3E:
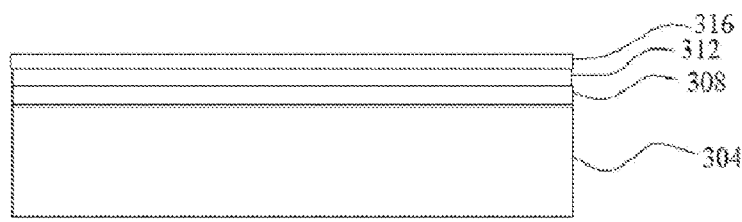
Figure 3F:
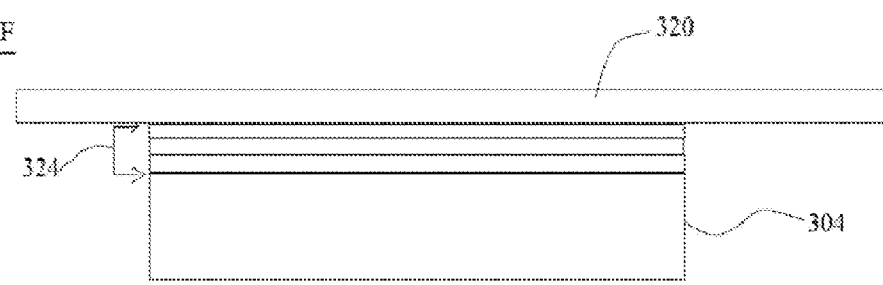
Figure 3G:
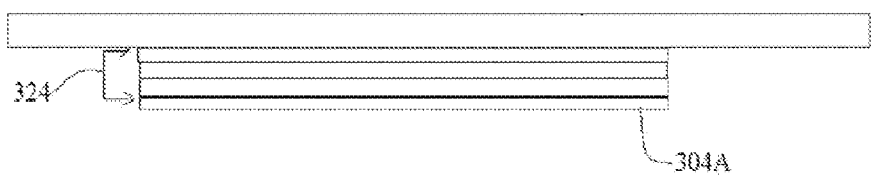
Figure 3H:
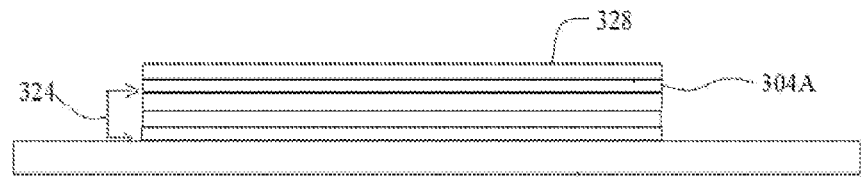

Referring now to the drawings, FIG. 1 illustrates a generalized method 100 of fabricating an optoelectronic device, for example, a light-emitting diode (LED), laser diode (LD), etc., that includes one or more epitaxial layers that each have a wurtzite crystal structure. Depending on the materials and processes utilized at the various steps of method 100, the method can produce high-power, high-performance, and long lasting optoelectronic devices, including true green LEDs and LDs, at a low cost. Such devices can have significant ramifications for a variety of applications, including solid state lighting, projection displays (e.g., micro-, nano-, and pico-projectors), information displays, video monitors and televisions, ophthalmic surgery, medical imaging (e.g., DNA sequencing machines, fiber-optic communications, non-lethal threat detection, and visual warning, among many others. An important contributor to the efficacy of method 100 in creating low cost high quality optoelectronic devices is the careful selection of the substrate platform and material(s) epitaxially formed thereon that results in the epitaxial layers having a wurtzite crystal structure, which is a well-known non-centrosymmetric example of a hexagonal crystal system. Generalized method 100 is described immediately below. Then, several methods that are particular instantiations of method 100 are described in connection with the creation of specific LED and LD optoelectronic devices. After that, a method 1100 that changes the order of several important steps relative to method 100 is presented.

Referring to FIG. 1, method 100 can be considered to start at step 105 at which an appropriate starting substrate is selected. As described below, the substrate selected at step 105 is used as the platform for epitaxial growth of at least one coating that has the wurtzite crystal structure. Consequently, the selection of the substrate at step 105 needs to be made in conjunction with the choice of semiconductor material(s) used for the epitaxial coating(s). Important considerations for selecting the substrate include its crystal structure and lattice constant (k). The crystal structure and lattice constant of the substrate should be selected such that the epitaxial semiconductor coating(s) achieve a wurtzite crystal structure. The starting substrate has to have the appropriate wurtzite (also called "hexagonal") structure along with the appropriate lattice constant for the deposited films to have the necessary wurtzite crystal structure.

As an example, when the epitaxial coating(s) is/are selected from the group of II-VI semiconductor materials (i.e., semiconductor materials containing elements from Groups II and VI of the Periodic Chart), the lattice constant of the selected substrate should fall within a range of about 3.74 Å to about 4.5 Å. Table I, below, lists some examples of desirable base substrate materials for II-VI semiconductor material(s) used in the epitaxial layer(s). By "base" materials, and like terms, it is meant that these are undoped materials; each of these materials can be doped with one or more suitable dopants to modify the electrical characteristics of the base material as desired/necessary. Such doping can be achieved using any suitable doping technique known. While Table I lists particular base materials for a starting substrate of the present disclosure, those skilled in the art will readily appreciate that materials other than those listed in Table I can be used for the selected substrate as long as each material selected is suitable for the particular material combination such that the result is that each of one or more epitaxial layers have a wurtzite crystal structure.

TABLE I

Exemplary Substrate Base Materials

| Material | Lattice Constant (Angstroms) |
|---|---|
| GaSe | ~3.74 |
| $WS_2$ | ~3.78 |
| $ZnIn_2S_4$ | ~3.82 |
| $SnS_2$ | ~4.1 |
| $Bi_2Se_3$ | ~4.15 |
| $Bi_2Te_3$ | ~4.38 |
| GeSe | ~4.38 |
| $PbI_2$ | ~4.5 |

The base materials listed in Table I are desirable because they are naturally layered, or lamellar, single crystals. This natural lamellar structure lends itself to some of the later steps of method 100 that are described below. Similar to above, the list of lamellar base materials in Table I is not exhaustive, since other lamellar single-crystal materials can be used as a substrate in method 100. Indeed, some other possible base materials are listed on pages 11 and 12 of Provisional Patent Application Ser. No. 61/573,709, filed on Sep. 12, 2011, and titled "Novel Method of Making a Laser Diode" ("the '709 application"), which is incorporated herein by reference for such listing and other information regarding materials for the substrate.

At optional step 110, the surface of the selected substrate can be cleaned and/or otherwise prepared for subsequent processing steps as desired or necessary. For example, wet/dry chemical cleaning using plasma, UV radiation, UHV annealing, etc., might assist in creating an intimate bond with the active device coating provided in step 115, below.

At step 115, an epitaxial semiconductor coating is provided on the surface of the starting substrate such that it has a wurtzite crystal structure. Those skilled in the art will appreciate that this coating can be applied in any suitable manner that results in it having a wurtzite crystal structure. This epitaxial coating can be provided for any of a number of reasons, such as, for example, to provide a wurtzite-crystal-structured layer for supporting epitaxial growth of one or more additional semiconductor layers (step 120, see below) having the wurtzite crystal structure, to provide an active device coating, to provide an etch stop layer, among others, and any meaningful combination of these. By "active device coating" it is meant that the coating contains a semiconducting material that actively participates in the functioning of the finished optoelectronic device when a voltage is applied to the device and/or when radiation is striking the device.

The semiconducting material of this coating is typically, though not necessarily, suitably doped to provide the coating with the desired/necessary electrical or optoelectrical properties. As mentioned above, desirable semiconducting materials for the coating (and subsequent coatings) include, but are not limited to, II-VI semiconducting materials. Lists of possible II-VI, III-V, and IV-VI semiconducting materials, as well as other materials, that can be used for the coating(s) appear in the '709 application at pages 13 and 14. The '709 application is incorporated herein by reference for all of its teachings regarding the epitaxial semiconductor coating applied to the substrate at step 115. It is noted that depending on the materials selected for the substrate and the coating applied to the substrate, and the doping of such materials, a suitable p-n junction based light-emitting region can be produced using only the substrate and the coating. However, as described below, one or more additional epitaxial semiconductor layers can be provided to produce other light-emitting structures.

For example, at optional step 120, one or more additional epitaxial semiconductor layers of desired/necessary thicknesses and desired/necessary dopings (species and density, including no doping (intrinsic)), can be applied, for example, as active device layers, on top of the coating applied at step 115. If any additional heteroepitaxial layer(s) is/are provided, each, too, can be provided using any suitable epitaxial growth/deposition technique that ideally results in that layer having a wurtzite crystal structure. As one example, if a second heteroepitaxial layer is provided, it can be an intrinsic layer of a p-i-n junction or may serve as a quantum confining layer, among other things. If a third heteroepitaxial layer is provided, that third layer can be made of the same base material as the coating applied at step 115. It can also be made of a different base material. As an example, if the second layer is an intrinsic layer as mentioned, the third layer can be made of the same base material as the coating applied at step 115, but oppositely doped therefrom such that the coating and the second and third epitaxial layers form the above-mentioned p-i-n junction. As will be seen in some of the specific exemplary methods and device architectures below, any other desired/necessary active device layer can be provided at optional step 120.

At step 125, an ohmic contact/conductive electrode (hereinafter, just "ohmic contact" or "electrode") is deposited over the epitaxial semiconductor coating applied at step 115. By "over" it is meant that the ohmic contact is provided on the side of the coating opposite the substrate, either in contact with the coating if no other layers are present from optional step 120 or in contact with the last-provided one of the additional layer(s) provided at step 120. As those skilled in the art will readily appreciate, the material(s) used for the ohmic contact can be transparent or opaque as desired/necessary and can be made of any suitable conductive material, such as a thin or thick metal film, transparent conductive oxide, nitride, oxynitride, etc. A partial list of possible materials for the ohmic contact provided at step 125 appear on pages 15 and 16 of the '709 application. That list and other information regarding this ohmic contact that is present in the '709 application are incorporated by reference herein. Those skilled in the art will readily understand the techniques necessary to provide the ohmic contact at step 125, such as deposition and patterning techniques, among others, such that further explanation is not necessary for skilled artisans to practice the present inventions to their fullest scope.

If the optoelectronic device made using method 100 requires one or more mirrors, such as a laser diode requiring mirrors to define an optical resonator, at optional step 130 a mirror, such as a distributed Bragg reflector (DBR), is provided over the ohmic contact of step 125. Examples of materials suitable for forming a mirror at step 130 are provided on pages 16-18 of the '709 application. That information and other information regarding mirrors that is present in the '709 application are incorporated by reference herein.

At step 135, a secondary substrate (or "handle") is secured to the structure made so far according to steps 105 through 130 as implemented. As described below, the secondary substrate is provided, at least in part, as a handle for separating the structure resulting from the performed ones of steps 110, 115, 120, 125, and 130, above, from the original substrate from step 105, which, as described above, is a lamellar material from which one or more lamella can be removed along with the layer(s) provided up to, and including, step 135. The secondary substrate can be a permanent or intermediate (temporary) substrate, and it can be made of any material suitable for the particular application at issue. For example, the secondary substrate can be made of a semiconductor material, for example, if it will be a functional part of the finished optoelectronic device that needs semiconducting properties. In other embodiments, the secondary substrate need not be a semiconductor material, but rather can be any other material suitable to function as a handle as mentioned above. The secondary substrate can be rigid or flexible as desired/needed. Examples of materials suitable for the secondary substrate appear on page 18-22 of the '709 application, which is incorporated herein by reference for its disclosure of secondary substrate materials and other information relating to the secondary substrate. In addition, the secondary substrate can include any one or more active device layers and/or other structures, such as wiring, optical windows, etc., desired/necessary in the finished optoelectronic device. The secondary substrate can be secured to the structure made up to step 135 using any suitable techniques, such as bonding, including chemical bonding, among others.

At step 140, the original substrate from step 105 is partially or completely removed, for example, by cleaving it along an included cleavage fracture created at a selected depth and/or by using any suitable removal technique(s), such as etching, ablation, etc. There is fundamentally no limit on the thickness of the original substrate removed with the structure formed using the performed ones of steps 110 to 135, and the thickness can range from less than 1 nm to several hundreds of nanometers to several hundred microns or more, as desired/necessary for a particular application. Cleaving can be accomplished using any suitable cleaving technique(s), some of which are described on pages 22-27 of the '709 application, which is incorporated herein by reference for its disclosure of cleaving and other material removal techniques. Once a portion of the original substrate has been removed along with the corresponding structure and handle, that portion can be further processed as desired/necessary. For example, the removed portion can be further reduced in thickness using one or more suitable techniques, such as further cleaving, etching, ablation, etc.

At step 145, a second ohmic contact is provided. The second ohmic contact can be provided, for example, to the portion of the original substrate remaining after step 140. If no such portion remains, the second ohmic contact can be provided to the active device coating provided at step 120, above. Like the first ohmic contact of step 125, the second ohmic contact of step 145 can be transparent or opaque and can be composed of a thick or thin metal film, a transparent conductive oxide, nitride, oxynitride, etc. A partial list of possible materials for the second ohmic contact provided at step 145 appear on pages 15 and 16 of the '709 application. As mentioned above, that list and other information regarding this ohmic contact that is present in the '709 application are incorporated by reference herein. Those skilled in the art will readily understand the techniques necessary to provide the second ohmic contact at step 145, such as deposition and patterning techniques, among others, such that further explanation is not necessary for skilled artisans to practice the present inventions to their fullest scope.

At optional step 150, if the optoelectronic device made using method 100 is, for example, a device having one or more mirrors, such as a laser diode requiring a pair of spaced mirrors that define an optical resonator, a mirror is provided. This mirror can be the only mirror of the optoelectronic device, or it can be one of multiple mirrors (e.g., a second mirror to a first mirror provided at step 130, above), such as in the case of the device being a laser diode having an optical resonator cavity. As with the mirror provided at step 130, the mirror provided at step 150 can be, for example, as a distributed Bragg reflector stack. Examples of materials suitable for forming a mirror at step 150 are provided on pages 16-18 of the '709 application. That information and other information regarding mirrors that is present in the '709 application are incorporated by reference herein.

At step 155, the optoelectronic device is further processed as necessary to create a functional device, for example, by adding wiring, passivation, optical windows, lenses, etc., and/or to create a finished product, for example, by dicing, packaging, etc. Those skilled in the art are readily familiar with such additional processing steps that further discussion of them is not necessary for those skilled in the art to understand and implement them without undue experimentation.

Referring now to FIGS. 2 and 3A to 3H, FIG. 2 illustrates a method 200 of making an LED 300 (FIG. 3A) using steps of method 100 of FIG. 1 and specific materials. For simplicity, because the various steps of method 200 will be readily understood and implementable to those skilled in the art once disclosed, the method of FIG. 2 is presented in table format in Table II, below. Where detail is not provided in Table II, for example, relative to particular materials, procedures etc., reference can be made to method 100 described above for such detail.

TABLE II

Method 200 of FIG. 2

| Step | FIG. | Description |
|---|---|---|
| 205 | 3B | Select an appropriately sized n-doped single crystal of GaSe semiconductor as a starting substrate 304. |
| 210 | | Clean the GaSe crystal surface of substrate 304 or conduct any other surface preparation work on the GaSe crystal surface, as desired. |
| 215 | 3C | Deposit (grow) an n-doped heteroepitaxial semiconductor layer 308 of ZnS of the desired thickness on top of substrate 304. It is noted that this particular combination of materials, assisted by an appropriate epitaxial deposition/growth process, will result in layer 308 having a wurtzite crystal structure. |
| 220 | 3D | Deposit (grow) a p-doped homoepitaxial semiconductor layer 312 of ZnS of the desired thickness on top of coating layer 308. Similar to layer 308, using proper deposition/growth techniques, which are known to those skilled in the art, layer 312 will likewise have a wurtzite crystal structure. |
| 225 | 3E | Deposit a first ohmic contact/conductive electrode 316 on the top of the epitaxial ZnS coating layer 312. Electrode 316 might be continuous/unpatterned or might be patterned like a comb structure, as is often typical. |
| 230 | 3F | Choose a suitable permanent/intermediate substrate 320 and bond it on top of the ohmic contact layer 316. |
| 235 | | Cure the assembly 324 so far to increase bond strength, if so desired. (This step is optional.) |
| 240 | 3G | Partially remove starting substrate 304 by cleaving, leaving a thin sliver 304A behind. This sliver can be any suitable thickness, such as a thickness in a range of about 1 nm to about 10 microns, or thicker. The bulk of starting GaSe substrate 304 that is cleaved off may be re-used as a starting substrate in creating another LED until it is exhausted. |
| 245 | 3H | Deposit a second ohmic contact/conductive electrode 328 onto exposed thin sliver 304A of starting substrate 304. Electrode 328 might be continuous/unpatterned or might be patterned like a comb structure, as is often typical. |
| 250 | | Further process the assembly as desired to create functional devices, etc. For example, add wiring, perform QC measurements, package, ship, etc. |

Those skilled in the art will readily appreciate that method 200 of FIG. 2 is merely exemplary of basic structures of the various layers that can be used. Following are a few examples of alternatives that can be implemented. In some embodiments, starting substrate 304 (FIG. 3B) could be p-doped GaSe, rather than the n-doped GaSe used in method 200. In some embodiments, instead of leaving sliver 304A (FIG. 3G) intact at step 240 of FIG. 2, it can be removed either partially or entirely. For example, if sliver 304A is absorbing relative to the wavelength of light that might be generated by the p-n junction 332 (FIG. 3A) of LED 300, then it could be desirable to remove the entire sliver at step 240. In addition, electrodes 316, 328 (FIG. 3A) can be located differently from the locations shown. For example, FIG. 4 illustrates an alternative LED structure 400 made using method 200 of FIG. 2, except that the two ohmic electrodes 404, 408 are located on the same side of the LED structure. Otherwise, LED structure 400 can be the same as LED 300 of FIG. 3A.

The starting substrate could be any other material that results in the formation of a wurtzite crystal structure in the epitaxial layers. Table III, below, lists some exemplary material combinations that can be implemented, for example, in method 200 of FIG. 2 and that use II-VI semiconductor materials and result in coatings having a wurtzite crystal structure. However, these combinations are by no means exhaustive of combinations that can be used to form functioning devices according to the general methodology of method 200 of FIG. 2.

TABLE III

Material Combinations for Wurtzite Crystal Structure using II-VI Semiconductor Materials for Coating(s)

| Substrate Material(s) | Coating Materials |
|---|---|
| GaSe, $WS_2$, $ZnIn_2S_4$ | ZnS, ZnSSe, ZnSe |
| $SnS_2$, $Bi_2Se_3$, GaTe | ZnSe, ZnSSe, CdS, CdSSe, HgS |
| $Bi_2Te_3$, GeSe | CdSe, CdSSe, ZnTe, HgSe |
| $PbI_2$ | CdTe, HgTe |

Figure 4:
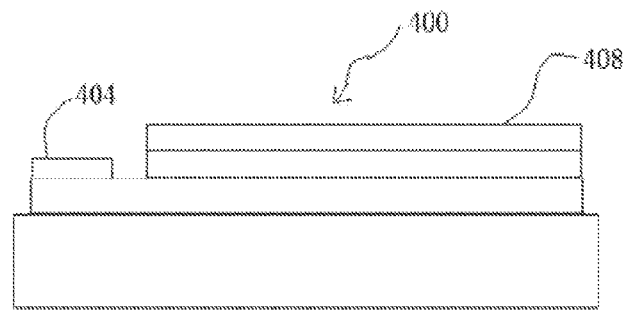
FIG. 4 is a schematic diagram of an LED that can be produced using method 200 of FIG. 2, wherein the LED has an alternative ohmic contact arrangement.
Figure 5:
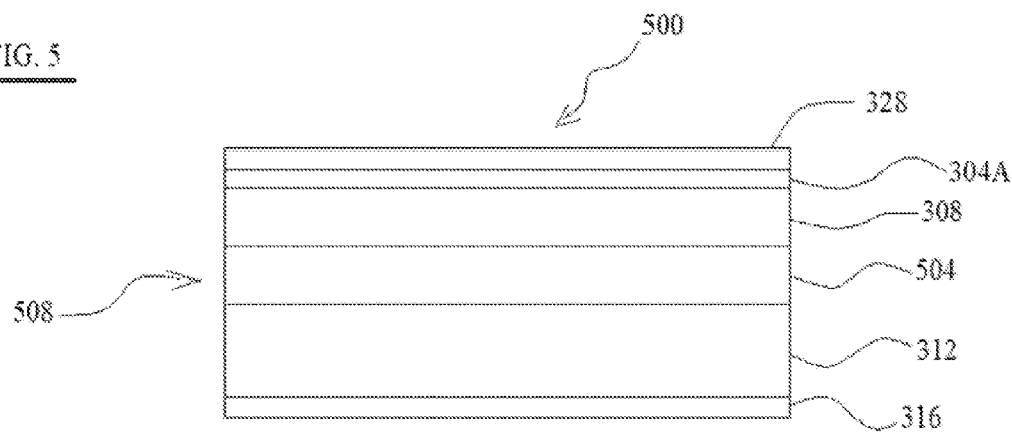
FIG. 5 is a schematic diagram of another LED that can be produced by modifying method 200 of FIG. 2 to create a p-i-n junction based device.

As seen in FIG. 3A, the device produced by method 200 as illustrated in FIG. 2 and Table II, above, is a p-n junction based LED 300 having p-n junction 332. However, those skilled in the art will readily appreciate that method 200 can be slightly modified to create a p-i-n junction based device, such as the device 500 shown in FIG. 5. Comparing FIG. 5 to FIG. 3A, it is seen that device 500 has the same GaSe sliver 304A, n-doped ZnS layer 308, p-doped ZnS layer 312, and electrodes 316, 328 as LED 300 of FIG. 3A. However, device 500 of FIG. 5 has an additional intrinsic ZnS layer 504 between layers 308 and 312 that also has a wurtzite crystal structure, just like layers 308, 312, so as to form a p-i-n junction 508. This can be accomplished by performing the additional step of depositing (growing) an intrinsic (i) type homoepitaxial layer of ZnS of the desired thickness on top of n-doped ZnS layer 308 (at step 215 of method 200 (FIG. 2 and Table II)) prior to forming p-doped ZnS layer 312 (at step 220 of method 200). Those skilled in the art will readily appreciate that all of the other modifications mentioned above relative to p-n junction embodiments can be implemented with a p-i-n junction embodiment.

Figure 6:
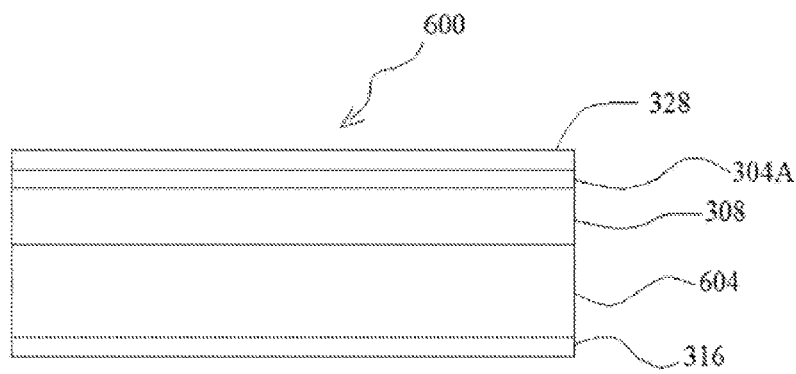
FIG. 6 is a schematic diagram of another LED that can be produced by modifying method 200 of FIG. 2 to create a heterojunction based device.

As also seen in FIG. 3A, the device produced by method 200 as illustrated in FIG. 2 and Table II, above, is a homo-junction based LED 300. However, those skilled in the art will readily appreciate that method 200 can be slightly modified to create a hetero-junction device, such as the LED 600 shown in FIG. 6. Comparing FIG. 6 to FIG. 3A, it is seen that LED 600 has the same GaSe sliver 304A, n-doped ZnS layer 308, and electrodes 316, 328 as LED 300 of FIG. 3A. However, in LED 600 of FIG. 6 layer 604, which corresponds to layer 312 of FIG. 3A, is an epitaxial layer that is p-doped, but is a material other than ZnS that has a wurtzite crystal structure, such as p-doped ZnSSe. LED 600 can be achieved using method 200 of FIG. 2 and Table II, above, by using a suitable semiconductor material other than ZnS at step 220. Those skilled in the art will readily appreciate that all of the other modifications mentioned above relative to homo-junction embodiments can be implemented with a hetero-junction embodiment.

Referring now to FIGS. 7 and 8A to 8H, FIG. 7 illustrates a method 700 of making an optoelectronic device 800 (FIG. 8H) using steps of method 100 of FIG. 1 and specific materials to create an architecture that allows for bandgap engineering, for example, using one or more quantum confined structures, such as quantum wells, strained quantum wells, super lattices (Types I and II), quantum wires, quantum dots, etc. For simplicity, because the various steps of method 700 will be readily understood and implementable to those skilled in the art once disclosed, the method of FIG. 7 is presented in table format in Table IV, below. Where detail is not provided in Table IV, for example, relative to particular materials, procedures etc., reference can be made to method 100 described above for such detail.

TABLE IV

Method 700 of FIG. 7

Figure 8A:
FIGS. 8A to 8H are schematic diagrams of the structures corresponding to various steps of the method of FIG. 7.
Figure 8B:
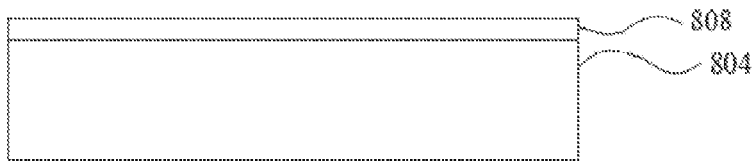
Figure 8C:
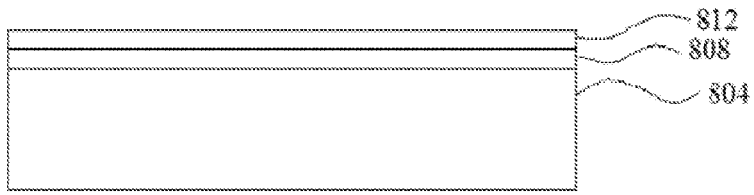
Figure 8D:
Figure 8E:
Figure 8F:
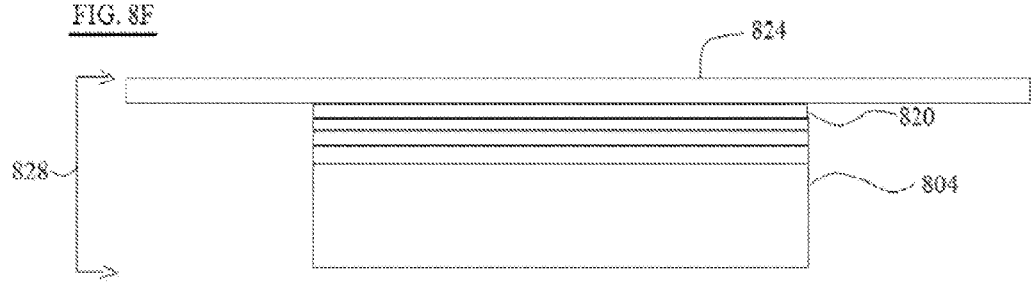
Figure 8G:
Figure 8H:
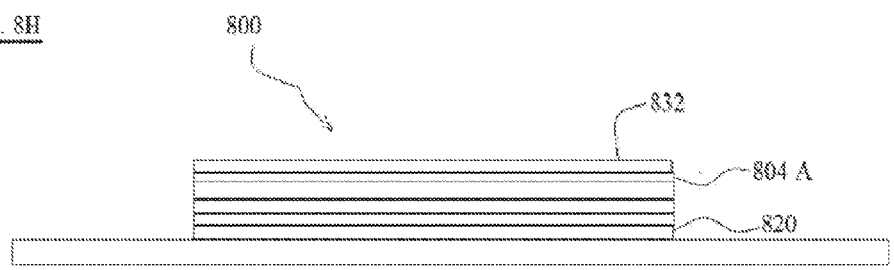

| Step | FIG. | Description |
|---|---|---|
| 705 | 8A | Select an appropriately sized n-doped single crystal of GaSe semiconductor as a starting substrate 804. |
| 710 | | Clean the GaSe crystal surface of substrate 804 or conduct any other surface preparation work on the GaSe crystal surface, as desired. |
| 715 | 8B | Deposit (grow) an n-doped heteroepitaxial semiconductor layer 808 of ZnS of the desired thickness on top of substrate 804. It is noted that this particular combination of materials, assisted by an appropriate epitaxial deposition/growth process, will result in layer 808 having a wurtzite crystal structure. |
| 720 | 8C | Deposit (grow) a heteroepitaxial quantum confining layer 812 of a semiconductor material of choice of the desired thickness on top of layer 808. The thickness of quantum confining layer 812 may be less than 100 nm, such as less than 50 nm, less than 30 nm, or less than 100 nm, depending upon the results desired and the materials used for the various layers of optoelectronic device 800 (FIG. 8H). The band gap of this semiconductor material is ideally smaller than the band gap of the ZnS layers (808, 816 (FIG. 8D)), which are also called barrier layers in this configuration. Similar to layer 808, using proper deposition/growth techniques, which are known to those skilled in the art, layer 812 will likewise have a wurtzite crystal structure. |
| 725 | 8D | Deposit (grow) a p-doped heteroepitaxial semiconductor layer 816 of ZnS of the desired thickness on top of coating layer 812. Similar to layers 808 and 812, using proper deposition/growth techniques, which are known to those skilled in the art, layer 816 will also have a wurtzite crystal structure. |
| 730 | 8E | Deposit a first ohmic contact/conductive electrode 820 on the top of the epitaxial ZnS coating layer 816. Electrode 820 might be continuous/unpatterned or might be patterned like a comb structure, as is often typical. |

TABLE IV-continued

Method 700 of FIG. 7

| Step | FIG. | Description |
|---|---|---|
| 735 | 8F | Choose a suitable permanent/intermediate substrate 824 and bond it on top of the ohmic contact layer 820. |
| 740 | | Cure the assembly 828 so far to increase bond strength, if so desired. (This step is optional.) |
| 745 | 8G | Partially remove starting substrate 804 (FIG. 8F) by cleaving, leaving a thin sliver 804A behind. This sliver can be any suitable thickness, such as a thickness in a range of about 1 nm to about 10 microns, or thicker. The bulk of starting GaSe substrate 804 that is cleaved off may be re-used as a starting substrate in creating another optoelectronic until it is exhausted. |
| 750 | 8H | Deposit a second ohmic contact/conductive electrode 832 onto exposed thin sliver 804A of starting substrate 804 (FIG. 8F). Electrode 832 might be continuous/unpatterned or might be patterned like a comb structure, as is often typical. |
| 755 | | Further process the assembly as desired to create functional devices, etc. For example, add wiring, perform QC measurements, package, ship, etc. |

Those skilled in the art will understand that additional layers can be interspaced between electrodes 820, 832 and the outside barrier layers, i.e., layers 808, 816, such as confinement layers, electron blocking layers, etc. Following are several specific material combinations that can be used in lieu of the combination illustrated in method 700 of FIG. 7 and Table IV. Those skilled in the art will appreciate that these material combinations are merely exemplary and that other material combinations are possible.

Material Combination 1:
   Starting substrate: GaSe (lattice constant ~3.74 Å)
   n-doped semiconductor coating layer: ZnS (lattice constant: 3.82 Å; crystal structure: wurtzite)
   p-doped semiconductor coating layer: ZnS
   Quantum confining layer: CdSe (lattice constant: 4.30 Å; crystal structure: wurtzite)

Material Combination 2:
   Starting substrate: GaSe (lattice constant: ~3.74 Å)
   n-doped semiconductor coating layer: ZnS (lattice constant: 3.82 Å; crystal structure: wurtzite)
   p-doped semiconductor coating layer: ZnS
   Quantum confining layer: CdS (lattice constant: 4.14 Å, crystal structure: wurtzite)

Material Combination 3:
   Starting substrate: GaSe (lattice constant: ~3.74 Å)
   n-doped semiconductor coating layer: ZnS (lattice constant: 3.82 Å; crystal structure: wurtzite)
   p-doped semiconductor coating layer: ZnS
   Quantum confining layer: HgS (lattice constant: 4.14 Å; crystal structure: wurtzite)

Material Combination 4:
   Starting substrate: GaSe (lattice constant: ~3.74 Å)
   n-doped semiconductor coating layer: ZnS (lattice constant: 3.82 Å; crystal structure: wurtzite)
   p-doped semiconductor coating layer: ZnS
   Quantum confining layer: $Cu_xS$ (lattice constant: 3.78-3.98 Å; crystal structure: wurtzite)

Material Combination 5:
   Starting substrate: $Bi_2Te_3$ (lattice constant: ~4.38 Å) or $Bi_2Se_3$ (lattice constant of ~4.15 Å)
   n-doped semiconductor coating layer: CdS (lattice constant: 4.14 Å; crystal structure: wurtzite)
   p-doped semiconductor coating layer: ZnTe (lattice constant: 4.27 Å; crystal structure: wurtzite)
   Quantum confining layer: CdSe (lattice constant: 4.30 Å; crystal structure—wurtzite) or HgS (lattice constant: 4.14 Å, crystal structure: wurtzite)

Material Combination 6:
   Starting substrate: GaSe (lattice constant: ~3.74 Å)
   n-doped semiconductor coating layer: ZnSe (lattice constant: 4.0 Å; crystal structure: wurtzite)
   p-doped semiconductor coating layer: $Cu_xS$ (lattice constant: 3.78-3.98 Å, crystal structure—wurtzite)
   Quantum confining layer: $Cu_xS$ (lattice constant: 3.78-3.98 Å; crystal structure: wurtzite)

ZnS is intrinsically n-doped, and it can also be p-doped with acceptors, such as nitrogen, In, and Ag, with hole concentrations of $~1 \times 10^{+19}$ $cm^{-3}$ to $10^{+18}$ $cm^{-3}$. This compares favorably with current blue GaN-based LEDs/LDs, wherein n-doped GaN is doped with donors, such as silicon with doping density $<10^{+19}$ $cm^{-3}$, and -p-doped GaN is doped with acceptors such as Magnesium with doping density $~1 \times 10^{+18}$ $cm^{-3}$. The starting GaSe layered/lamellar single crystal may be substituted/replaced by any other material that might result in a wurtzite crystal structure for the deposited layers. More notable ones of those materials include GaTe, $WS_2$, $ZnIn_2S_4$, $SnS_2$, $Bi_2Se_3$, $Bi_2Te_3$, GeSe, and $PbI_2$.

As those skilled in the art will readily appreciate, method 700 of FIG. 7 and Table IV can be used to create a device, such as optoelectronic device 800 (FIG. 8H) having a single quantum confined layer. However, it can be advantageous to create optoelectronic devices having multiple quantum confining layers, such as quantum wells and super lattices to increase the efficiency of such devices. As the name suggests, a multiple quantum confining device is similar to the construction of the single quantum confining device above, excepting that the quantum confining layer stack is repeated multiple times, for example, 4 to 8 times. This can readily be achieved by modifying method 700 as follows. Step 725 is modified from depositing (growing) p-doped epitaxial layer 816 (FIG. 8D) onto quantum confining layer 812 to depositing a undoped ZnS layer (not shown). Then, step 720, modified step 725, and step 720, again, would be repeated as many times as desired. Following the repeated steps, original step 725 and steps 730 to 755 would be repeated to finish the multiple quantum confinement layer optoelectronic device.

The ZnS layer from modified step 725 can be undoped if so desired. It is only necessary to have the ZnS layer p-doped when step 730 is to be performed immediately after it. As is well known, if the thickness of the ZnS layer of modified step 725 is large (relatively speaking) such that the wave-functions in the different quantum wells do not interact, the device structure is referred to as "multi-quantum well" (MQW). If, however, the layer thicknesses are small enough for tunneling and the wave-functions to overlap and interact, the device structure is called a "super lattice" (SL). All the quantum confining layers may be of the same thicknesses and the same material, or may be of different thicknesses and different materials. Similarly, the barrier layers around the quantum confining layers may be the same thicknesses and same material, or may be of different thicknesses and different materials. It will be understood that additional layers, such as confinement layers, electron blocking layers, etc., can be interspaced in between and outside the MQW regions, as outlined in earlier embodiments. All of the permutations of materials described and referred to herein can be applied to a multiple confinement layer device as appropriate.

Figure 9:
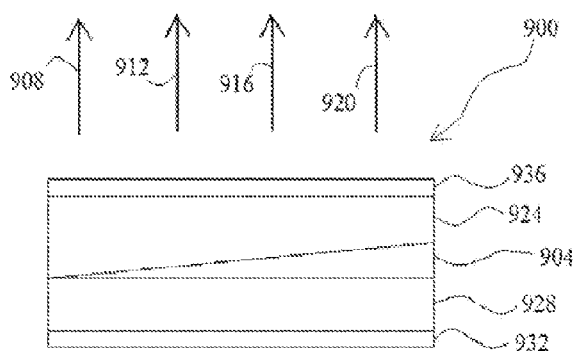
FIG. 9 is a schematic diagram of an optoelectronic device having a sloped quantum confining layer.

In the embodiments mentioned above, each quantum confining layer was of substantially uniform thickness, yielding a singular band gap for that particular thickness. Hence the result would be pseudo-monochromatic light emission (light emission with a small wavelength spread). However, in some applications, it would be advantageous to have a quantum confining layer with substantially non-uniform profile. This is depicted in optoelectronic device 900 of FIG. 9, in which a quantum confining layer 904 has varying thickness, here a thickness that changes at a constant rate such that the layer appears as a triangular wedge. In other embodiments, the changing thickness need not be uniform, but rather could change, for example, in a step fashion or at a changing rate, depending on the desired results. FIG. 9 illustrates how the wavelength of emitted light from a finished device will be composed of a multitude of wavelengths (multi-chromatic), as depicted by the four emissions 908, 912, 916, and 920 of differing wavelengths $\lambda_1$, $\lambda_2$, $\lambda_3$, and $\lambda_4$, respectively. In the particular architecture of FIG. 9, quantum confinement occurs not only in the vertical axis (due to the thickness of the quantum confining layer) but also in the lateral direction.

Other parts of optoelectronic device 900 include a n-doped semiconductor layer 924, a p-doped semiconductor layer 928, a first ohmic contact/electrode 932, and a second ohmic contact/electrode 936. Those skilled in the art will readily understand how optoelectronic device 900 can be made, for example, using method 700 of FIG. 7 and Table IV, above. In this case, the starting substrate, corresponding to substrate 804 of FIG. 8A, has been completely removed, and thus it is not seen in optoelectronic device 900 of FIG. 9. If method 700 of FIG. 7 and Table IV is used, quantum confining layer 904 can be created at step 720 using a judicious choice of moving masks, obstructions, angular position inside the deposition chamber with respect to the deposition source, etc., such that sections of the coated quantum confining layer are thicker in some spatial locations versus others. Alternatively, a substantially uniformly thick quantum confining layer can be provided at step 720. Then, that layer may be preferentially etched/ablated to create the layer thickness variation desired. Direct etching can be done by, for example, ion beam etching, chemical etching, laser assisted etching, photo-ablation, and directed plasma etching, among other techniques. As another alternative, techniques including gray scale lithography, micro/nano imprinting, may be used to create the desired patterns in a photoresist. The pattern would then be subsequently transferred into a uniformly thick quantum confining layer using isotropic or anisotropic etching mechanisms to create the layer thickness variation desired. While certain representative examples have been given for purposes of illustrating the wide variety of techniques that can be used to create an optoelectronic device of the present invention having one or more quantum confining layers, it will be apparent to those skilled in the art that techniques not disclosed herein may be incorporated without departing from the scope of the invention.

As is known, an LD (laser diode) is an extension of an LED. Similar to an LED, an LD is an electrically pumped semiconductor LED with the addition of reflective mirrors that create the boundary conditions (optical feedback) around the LED necessary for light amplification by stimulated incident photons. Laser diodes come in a variety of types, such as those having integrated, i.e., monolithic, optical resonator designs and those having external optical resonator designs. Examples of the former include edge emitting lasers, surface emitting lasers, distributed feedback lasers, broad area laser diodes, slab coupled optical waveguide lasers, diode bars, and vertical cavity surface emitting lasers, among others. Examples of the latter include external cavity laser or external cavity diode lasers, and vertical external cavity surface emitting lasers (VECSEL), among others. In addition, LDs can be tunable, if so desired. Those skilled in the art will readily appreciate that the techniques and wurtzite crystal structure containing LEDs of the present disclosure can be used for both integrated and external LDs by providing suitable mirrors that create the necessary boundary conditions for lasing.

Figure 10A:
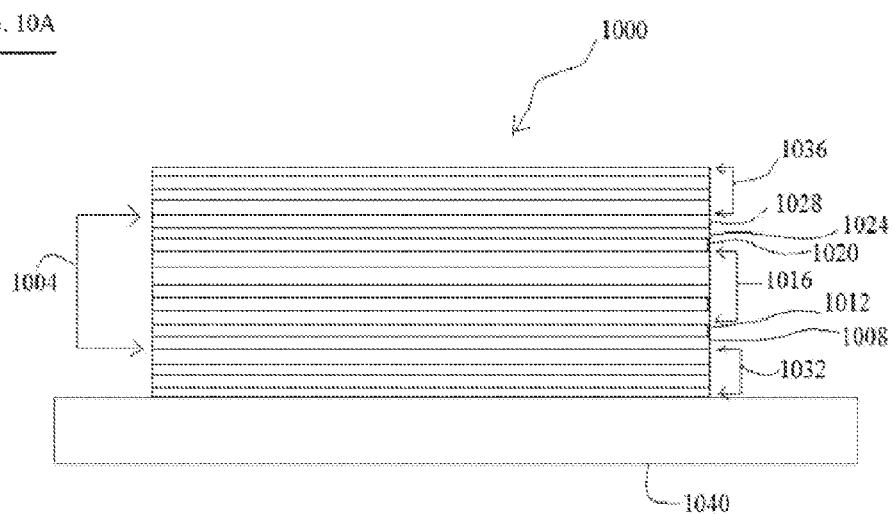
FIG. 10A is a schematic diagram of an integrated vertical cavity surface emitting laser diode (LD) made in accordance with the present invention.

One example of an LD architecture mentioned above is an integrated vertical cavity surface emitting architecture. This architecture can be instantiated using techniques disclosed herein, for example, using the multiple quantum confining layer modification to method 700 of FIG. 7 and Table IV that is described above. FIG. 10A illustrates an integrated vertical cavity LD 1000 made using the modified method 700. Referring to FIG. 10A, and also to FIG. 7 and/or Table IV, the basic structure 1004 created using the modified method 700 comprises a first ohmic contact/electrode 1008 (step 730), a p-doped ZnS layer 1012 (step 725), a multiple quantum confining layer stack 1016 (modified step 725, repeated with step 720 repeated before and after each modified step 725), an n-doped ZnS layer 1020 (step 715), a GaSe sliver 1024 (step 745), and a second ohmic contact/electrode 1028 (step 750). To make LD 1000, to this basic structure 1004 are added a first mirror, here a first distributed Bragg reflector (DBR) 1032 and a second mirror, here a second DBR 1036. Relating the additions of first and second DBRs 1032 and 1036 to method 700, those skilled in the art will readily appreciate that first DBR 1032 can be formed on first electrode 1008 between steps 730 and 735 such that at step 735 a permanent/intermediate substrate 1040 is bonded to the first DBR rather than the first electrode. Then, second DBR 1036 can be formed on second electrode 1028 after step 750. Like method 700 and its modification, the material combination depicted in this example is merely illustrative and is non-limiting.

As is typical in LD construction, one of DBRs 1032, 1036 will typically be highly reflective with a reflectance of 99% or higher, whereas the other DBR will be a "partial" reflector to allow some light to escape per pass. DBRs 1032, 1036 can be made of dielectric materials and can be deposited at low temperature. The ability to remove the starting GaSe substrate removes the constraints of having DBRs 1032, 1036 be semiconductors to allow charge transport through them. The starting GaSe substrate (not shown) is opaque to green light, and if a UV-blue or green LED or LD is constructed, the GaSe substrate can be completely removed. As already described, GaSe is readily cleavable and can be chemically etched. Albeit that single crystals of GaSe are currently expensive to grow, because the crystal can be cleaved repeatedly, the overall substrate cost can be very low. For example, a 1 mm thick starting wafer can be cleaved into 10-micron slivers, thereby yielding 100 wafers of 10-micron thickness. The present inventor has devised an architecture that might possibly yield red, green, and blue LEDs and LDs on a singular die by using either thickness variation or compositional variation of the quantum well layer. An additional enhancement might be realized by using quantum dots in lieu of a quantum well as the quantum confining layers. This should be possible with the methodology outlined above.

The architecture of LD 1000 is also called a "vertical cavity surface emitting laser." Once completed, the novel LD will allow for an ultra slim form factor that can be made flexible, conformal, or bendable. Furthermore, with judicious engineering a suitable material, e.g., diamond, diamond-like carbon, carbon nanotube, etc., can be deposited/bonded on second DBR 1036 to serve as an integrated transparent heat sink layer. Laser diode 1000 is a monolithic inorganic stack, thereby skirting any issues with lifetime, encapsulation etc., as compared to organic devices. The general methodology is scalable to realize LEDs/LDs in the blue, UV, and DUV ranges as well.

It is apparent that the architecture may be modified many different ways, while still maintaining the basic functionality.

Figure 10B:
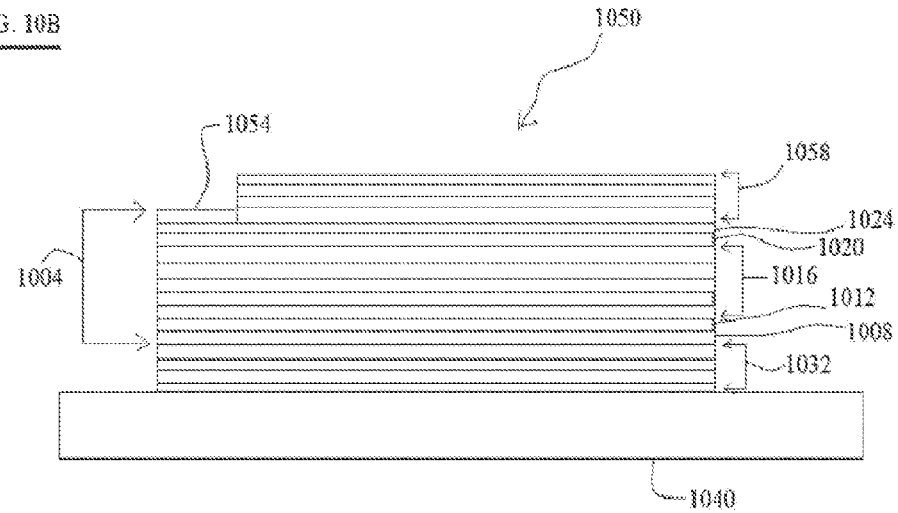
FIG. 10B is a schematic diagram of an alternative integrated vertical cavity surface emitting LD made in accordance with the present invention.

For example, if the ohmic contact(s)/electrode(s) 1008, 1028 were non-transparent or absorbing, it may be more efficient to pattern them prior to depositing DBRs 1032, 1036, as depicted in LD 1050 of FIG. 10B. Referring to FIG. 10B, LD 1050 is largely the same as LD 1000 of FIG. 10A, except that in LD 1050 the second ohmic contact 1054 is patterned and second DBR 1058 is in direct contact with GaSe sliver 1024. The other layers of LD 1050 can be identical to the corresponding layers of LD 1000 of FIG. 10A.

Earlier embodiments depict rudimentary LED architectures. Modern LEDs, however, can have a multitude of additional layers surrounding the light emitting layer(s), which results in increased electrical to photon conversion efficiencies. These additional layers can serve the function of: hole injection layer, hole blocking layer, hole transport layer, electron injection layer, electron blocking layer, electron transport layer, exciton blocking layer, cladding layers, guiding layers, DBR, thin/insulating (tunneling/buffer layers), current spreading layers, confinement layers, Forster energy transfer layers, passivation layers, etc. Those skilled in the art will readily appreciate that any one or more of these additional layers can be included in any of the basic optoelectronic device structures disclosed herein. Furthermore, those skilled in the art will understand the modifications to the disclosed exemplary methods that need to be made to accommodate the additional layer(s), such that detailed explanations are not needed herein for them to practice the present invention to the fullest scope as defined by the appended claims.

In embodiments described above, one or more layers are grown/deposited prior to cleaving the starting substrate. However, that need not be the case. In another example, a sliver is cleaved from a starting substrate before any layers are grown/deposited onto the growth surface. This is depicted in method 1100 of FIG. 11, which is summarized in Table V, below, with additional references to FIGS. 12A to 12D that illustrate various steps of the method.

TABLE V

Method 1100 of FIG. 11

Figure 12A:
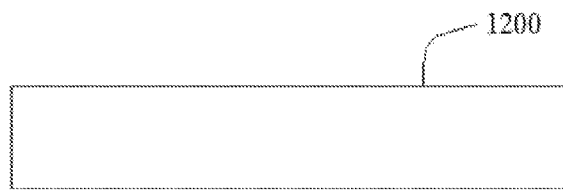
FIGS. 12A to 12D are schematic diagrams of the structures corresponding to various steps of the method of FIG. 11.
Figure 12B:
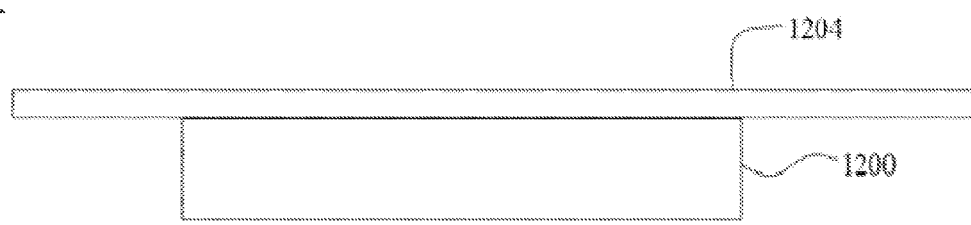
Figure 12C:
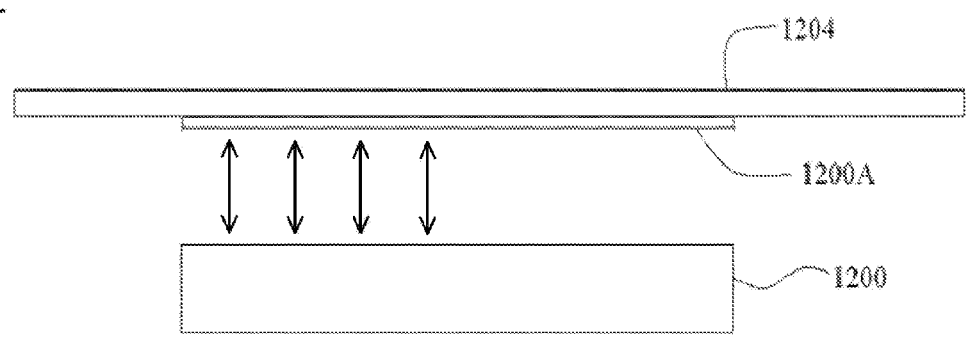
Figure 12D:
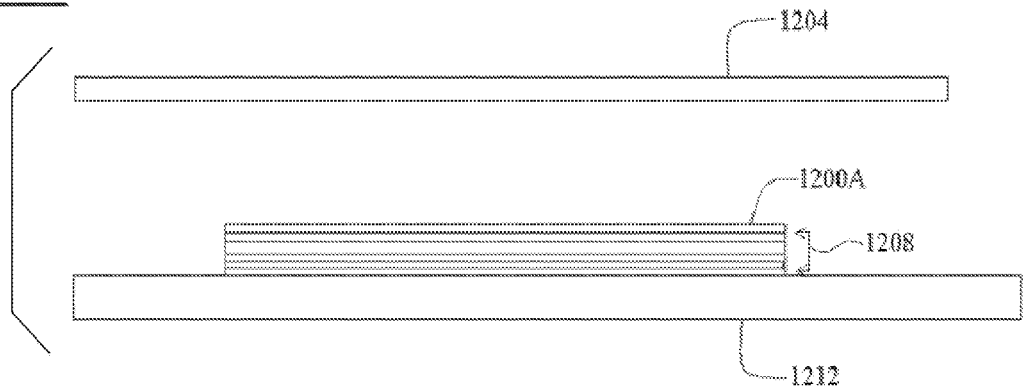

| Step | FIG. | Description |
|---|---|---|
| 1105 | 12A | Select an appropriately sized n-doped single crystal of layered/lamellar semiconductor material as a starting substrate 1200. |
| 1110 | | Clean the crystal surface of substrate 1200 or conduct any other surface preparation work on the crystal surface, as desired. |
| 1115 | 12B | Choose a suitable temporary substrate 1204 and bond it on top of starting substrate 1200. |
| 1120 | 12C | Detach temporary substrate 1204 along with a thin sliver/slice 1200A of the layered lamellar material from the bulk of the layered semiconductor crystal substrate 1200, for example, by releasing it along an induced cleavage fracture created at an appropriate depth. |
| 1125 | 12D | Deposit (grow) one or more semiconductor layers having a wurtzite crystal structure and apply one or more other layers, such as a first ohmic contact/electrode. In FIG. 12D, the combination of all of these layers is depicted as a coating stack 1208. These layers can be created using any of the techniques described or mentioned above, for example, relative to method 100 of FIG. 1 or method 700 of FIG. 7. |
| 1130 | 12D | Bond a permanent/intermediate substrate 1212 to the exposed surface of coating stack 1208. |
| 1135 | 12D | De-bond temporary substrate 1204 from thin sliver/slice 1200A of substrate 1200 along with coating stack 1208 by de-bonding the assemblage along the interface of the temporary substrate and the thin sliver interface. |
| 1140 | | Optionally, clean the now exposed surface of thin sliver/slice 1200A and/or conduct any other surface preparation work on this surface, as desired/necessary. |
| 1145 | | Deposit (grow) one or more semiconductor layers and/or apply one or more other layers (not shown), such as a second ohmic contact/electrode, over thin sliver/slice 1200A, and perform any additional processing necessary to finish the device. |

Temporary substrate 1204 may be chosen from the permanent/intermediate substrate materials already outlined. Temporary substrate 1204 may not be required if reversible bonding techniques are used. Examples of such techniques are listed on page 58 of the '709 application, which is incorporated herein by reference for such listing and other information regarding reversible bonding. Furthermore, the permutations described elsewhere in this disclosure are also applicable to the embodiment of FIGS. 11 and 12A to 12D.

High quality II-VI coatings and other coatings allow for the creation of optoelectronic devices other than LEDs and LDs, such as: optical detectors; image sensors; microbolometers; type I and II superlattices; quantum cascade lasers and detectors; avalanche photodiodes; inter sub-band detectors; unipolar avalanche photodiodes; electro-optic light modulators;

photonic light circuits, including photonic waveguides; quantum well light modulators; and electro absorption modulators; among others. These devices may operate not only in the visible spectra, but also, or alternatively, in the NIR, MWIR and FIR, in any meaningful combination. They may be planar or non-planar. Those skilled in the art will readily be able to make such devices using the basic techniques disclosed herein and applying them to the architectures needed for those devices without undue experimentation. For example, relative to electromagnetic radiation detectors, those skilled in the art will recognize that the basic structures of such detectors can be the same as the basic structures of the light-emitting devices provided as examples herein. Essentially, detectors can be light emitters operated in reverse. That is, instead of applying a voltage across a device of the present invention to cause it to emit electromagnetic radiation, a voltage across the device can be sensed to determine when such radiation impinges on the device. Consequently, though each of the explicit examples shown in the accompanying drawings is referred to as a light-emitting device, these devices can also be detectors.

Novel aspects of methods and structures disclosed herein include:

Using a layered/lamellar single crystal as the starting substrate for LED/LD construction;

Using GaSe, GaTe, $WS_2$, $ZnIn_2S_4$, $SnS_2$, $Bi_2Se_3$, $Bi_2Te_3$, GeSe, $PbI_2$ layered/lamellar single crystals as the starting substrate for LED/LD construction;

Using II-VI coating materials with a wurtzite crystal structure for making LEDs and LDs;

Reducing/eliminating/mitigating failure mechanisms in prior art II-VI coating materials by using novel substrate and resulting novel/stable coating crystal structure;

Using a vertical cavity architecture as opposed to lateral cavity (edge emitters) used in prior art;

Using a vertical cavity architecture with integrated or external reflectors;

Fabrication method allowing for the decoupling of electrical and optical functionalities; lower temperature deposited dielectric DBRs can be used, as opposed to epitaxial single crystalline semiconductor DBRs (this can be a process and design limiting constraint);

Vertical cavity allowing for on chip/on wafer evaluation and diagnostics, simpler optics, and alignment of resulting LEDS and LDs, as well as the potential to devise an integrated heat sink;

Potential to realize multicolor LEDs and LDs on same chip;

Single/multi use starting substrate allowing for reduction in overall manufacturing cost;

Lower temperature II-VI coatings than competing III-V (InGaN) coatings results in lower thermal budget; and Potential for creating solid state LEDs and LDs that are flexible, conformal, foldable, and/or rollable.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of fabricating a light-generating optoelectronic device, the method comprising:
   providing a starting substrate, wherein the starting substrate has a naturally lamellar single-crystal structure and is selected to induce a wurtzite crystal structure in a coating layer applied to the starting substrate, wherein the coating layer comprises a II-VI semiconductor;
   forming a light-generating optoelectronic structure, wherein said forming the light-generating optoelectronic structure includes forming the coating layer as an epitaxial layer on the starting substrate so that the coating layer has the wurtzite crystal structure, wherein the coating layer has a base composition of a II-VI semiconductor base composition or a I-VI semiconductor base composition;
   cleaving the starting substrate so as to provide a sliver of the starting substrate on which the coating layer is formed; and
   providing a pair of electrodes in electrical communication with the light-generating optoelectronic structure so that when a current is supplied across the light-generating optoelectronic structure via the pair of electrodes the light-generating optoelectronic structure emits light.

2. A method according to claim 1, wherein said providing a starting substrate includes providing a substrate having a base selected from the group consisting of GaTe, $WS_2$, $ZnIn_2S_4$, $SnS_2$, $Bi_2Se_3$, $Bi_2Te_3$, GeSe, and $PbI_2$.

3. A method according to claim 2, wherein said forming a coating layer as an epitaxial layer includes forming a coating layer wherein the coating layer has a II-VI semiconductor base composition selected from a group consisting of ZnS, ZnSSe, ZnSe, CdS, CdSSe, HgS, CdSe, ZnTe, HgSe, CdTe, and HgTe.

4. A method according to claim 3, wherein:
   said providing a starting substrate includes providing a substrate having a base selected from the group consisting of $WS_2$ and $ZnIn_2S_4$; and
   said forming a coating layer as an epitaxial layer includes forming a coating layer wherein the coating layer has a II-VI semiconductor base composition selected from a group consisting of ZnS, ZnSSe, ZnSe.

5. A method according to claim 3, wherein:
   said providing a starting substrate includes providing a substrate having a base selected from the group consisting of $SnS_2$, $Bi_2Se_3$, and GaTe; and
   said forming a coating layer as an epitaxial layer includes forming a coating layer wherein the coating layer has a II-VI semiconductor base composition selected from a group consisting of ZnSe, ZnSSe, CdS, CdSSe, and HgS.

6. A method according to claim 3, wherein:
   said providing a starting substrate includes providing a substrate having a base selected from a group consisting of $Bi_2Te_3$ and GeSe; and
   said forming a coating layer as an epitaxial layer includes forming a coating layer wherein the coating layer has a II-VI semiconductor base composition selected from a group consisting of CdSe, CdSSe, ZnTe, and HgSe.

7. A method according to claim 3, wherein:
   said providing a starting substrate includes providing a substrate having a base of $PbI_2$; and
   said forming a coating layer as an epitaxial layer includes forming a coating layer wherein the coating layer has a II-VI semiconductor base composition selected from a group consisting of CdTe and HgTe.

8. A method according to claim 1, wherein:
   said providing a starting substrate includes providing a substrate having a base of GaSe; and
   said forming a coating layer as an epitaxial layer includes forming a coating layer wherein the coating layer has a II-VI semiconductor base composition selected from a group consisting of ZnS, ZnSSe, and ZnSe.

9. A method according to claim 1, wherein:
said providing a starting substrate includes providing a substrate having a base of GaSe; and
said forming a light-generating optoelectronic structure includes:
   forming, on the starting substrate, a first ZnS coating layer having a wurtzite crystal structure and a doping of a first type;
   forming, over the first ZnS coating layer, a CdSe quantum confining layer having a wurtzite crystal structure; and
   forming, over the CdSe quantum confining layer, a second ZnS coating layer having a wurtzite crystal structure and a doping of a second doping type opposite the first doping type.

10. A method according to claim 1, wherein:
said providing a starting substrate includes providing a substrate having a base of GaSe; and
said forming a light-generating optoelectronic structure includes:
   forming, on the starting substrate, a first ZnS coating layer having a wurtzite crystal structure and a doping of a first type;
   forming, over the first ZnS coating layer, a CdS quantum confining layer having a wurtzite crystal structure; and
   forming, over the CdS quantum confining layer, a second ZnS coating layer having a wurtzite crystal structure and a doping of a second doping type opposite the first doping type.

11. A method according to claim 1, wherein:
said providing a starting substrate includes providing a substrate having a base of GaSe; and
said forming a light-generating optoelectronic structure includes:
   forming, on the starting substrate, a first ZnS coating layer having a wurtzite crystal structure and a doping of a first type;
   forming, over the first ZnS coating layer, a HgS quantum confining layer having a wurtzite crystal structure; and
   forming, over the HgS quantum confining layer, a second ZnS coating layer having a wurtzite crystal structure and a doping of a second doping type opposite the first doping type.

12. A method according to claim 1, wherein:
said providing a starting substrate includes providing a substrate having a base of GaSe; and
said forming a light-generating optoelectronic structure includes:
   forming, on the starting substrate, a first ZnS coating layer having a wurtzite crystal structure and a doping of a first type;
   forming, over the first ZnS coating layer, a $Cu_xS$ quantum confining layer having a wurtzite crystal structure; and
   forming, over the $Cu_xS$ quantum confining layer, a second ZnS coating layer having a wurtzite crystal structure and a doping of a second doping type opposite the first doping type.

13. A method according to claim 1, wherein:
said providing a starting substrate includes providing a substrate having a base selected from a group consisting of $Bi_2Te_3$ and $Bi_2Se_3$; and
said forming a light-generating optoelectronic structure includes:
   forming, on the starting substrate, a CdS coating layer having a wurtzite crystal structure and a doping of a first type;
   forming, over the CdS coating layer, a quantum confining layer having a wurtzite crystal structure and a base composition selected from the group consisting of CdSe and HgS; and
   forming, over the quantum confining layer, a ZnTe coating layer having a wurtzite crystal structure and a doping of a second doping type opposite the first doping type.

14. A method according to claim 1, wherein:
said providing a starting substrate includes providing a substrate having a base of GaSe; and
said forming a light-generating optoelectronic structure includes:
   forming, on the starting substrate, a ZnSe coating layer having a wurtzite crystal structure and a doping of a first type;
   forming, over the ZnSe coating layer, a $Cu_xS$ quantum confining layer having a wurtzite crystal structure; and
   forming, over the $Cu_xS$ quantum confining layer, a $Cu_xS$ coating layer having a wurtzite crystal structure and a doping of a second doping type opposite the first doping type.

15. A method according to claim 1, further comprising finishing fabricating the surface-emitting light-generating optoelectronic device so that at least a portion of the sliver of the starting substrate remains intact.

16. A method according to claim 1, further comprising removing the sliver of the starting substrate prior to finishing fabricating the surface-emitting light-generating optoelectronic device.

17. A method according to claim 1, wherein said providing a pair of electrodes includes providing the pair of electrodes on opposite sides of the coating layer.

18. A method according to claim 1, wherein said providing a pair of electrodes includes providing the pair of electrodes on the same side of the coating layer.

19. A method according to claim 1, wherein said cleaving the starting substrate includes cleaving the starting substrate after said forming the coating layer.

20. A method according to claim 1, wherein said cleaving the starting substrate includes cleaving the starting substrate before forming the coating layer.

21. A method according to claim 1, wherein said forming a coating layer as an epitaxial layer includes forming a coating layer wherein the coating layer has a I-VI semiconductor base composition.

22. A method according to claim 21, wherein said forming a coating layer having a I-VI semiconductor base composition includes forming a coating layer having a copper sulfide base composition.

* * * * *